(12) United States Patent
Tse et al.

(10) Patent No.: US 6,797,967 B1
(45) Date of Patent: Sep. 28, 2004

(54) METHOD AND SYSTEM FOR DOSE CONTROL DURING AN ION IMPLANTATION PROCESS

(75) Inventors: Tom Tse, Austin, TX (US); Zhiyong Zhao, Austin, TX (US); David M. Hendrix, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/082,567

(22) Filed: Feb. 25, 2002

(51) Int. Cl.$^7$ .............................. G21K 5/00; G21K 5/10; H01J 37/08
(52) U.S. Cl. .............................. 250/492.21; 250/492.1; 250/492.2; 250/492.22; 250/492.3
(58) Field of Search ................................ 250/306, 309, 250/251, 492.1, 492.2, 492.3, 492.21, 492.22

(56) References Cited

U.S. PATENT DOCUMENTS

| | | | | |
|---|---|---|---|---|
| 5,138,173 A | * | 8/1992 | Mitsuo | 250/492.2 |
| 5,811,823 A | * | 9/1998 | Blake et al. | 250/492.21 |
| 5,998,798 A | * | 12/1999 | Halling et al. | 250/492.21 |
| 6,137,112 A | * | 10/2000 | McIntyre et al. | 250/492.21 |
| 6,323,497 B1 | * | 11/2001 | Walther | 250/492.21 |
| 6,437,351 B1 | * | 8/2002 | Smick et al. | 250/492.21 |
| 6,497,194 B1 | * | 12/2002 | Libby et al. | 118/723 FI |
| 6,600,163 B2 | * | 7/2003 | Halling | 250/492.21 |

* cited by examiner

*Primary Examiner*—John R. Lee
*Assistant Examiner*—Mary El-Shammaa

(57) ABSTRACT

A method is presented for compensating for the effects of charge neutralization in calculating the 'true' ion dose, i.e., the dose assuming no changes of charge state of ions during an implantation process. An ion beam is generated under normal operating conditions, e.g., stable vacuum exists, and no target is being implanted. At least one additional detector would be positioned in the target chamber, and a dose measurement conducted simultaneously with a measurement of the beam current with the Faraday, which is located outside of the charge neutralization region, to establish a reference ratio. A wafer is then placed at the target location, and simultaneous measurements made with the additional detector and Faraday, as before, to determine the ratio between the beam current and the detector during wafer implantation. Any drift from the reference ratio indicates the dose error due to charge neutralization from wafer outgassing during implantation. Software for controlling various parameters could be configured to use the ratio drift data to change the dose counter to compensate for the dose error due to charge neutralization.

20 Claims, 3 Drawing Sheets

METHOD AND SYSTEM FOR DOSE CONTROL DURING AN ION IMPLANTATION PROCESS

FIELD OF THE DISCLOSURE

The present invention relates generally to improvements in or relating to the control of ion dose in an ion implantation process, and more particularly to a method for compensating for the total ion dose implanted into semiconductor wafers by an ion implantation system during the implantation process.

BACKGROUND

Ion implantation uses charged particles (ions) to penetrate beneath a material's surface, which gives the material unique electronic, mechanical, or chemical properties. Ion implantation is deemed as a key technique in the microelectronics industry, It is also used in other manufacturing sectors for its demonstrated potential for hardening of surfaces and for enhancing the corrosion properties of metals. Within the semiconductor manufacturing industry, ion implantation techniques are used to introduce impurity atoms into semiconductor substrates to alter the conductivity of the substrate in a controlled fashion. In ion implantation, electrically charged ions are accelerated under the action of an electric field and implanted into a solid target, i.e., a semiconductor wafer. Ion implanters generally comprise an ion beam generator for generating a beam of ions, a mass analyzer for selecting a particular species of ions in the ion beam, and a means to direct the ion beam through a vacuum chamber onto a target substrate supported on a holder.

The cross-sectional area of an ion beam is dependant upon various factors such as beam line configuration, degree of focusing applied to the ion beam, the gas pressure along the beam line, the energy of the ion beam, and the mass of the ions. Typically, the cross-sectional area of the ion beam at the target is less than the surface area of the target, e.g., a sen-conductor substrate. This requires beam traversal over the substrate in a one- or two-dimensional scan such that the beam covers the whole surface of the substrate. There are several two-dimensional scanning techniques commonly used in ion implantation systems to effect beam traversal: electrostatic and/or magnetic deflection of the ion beam in relation to a fixed target; mechanical scanning of the target substrate in two dimensions relative to a fixed ion beam; and an amalgamation of both techniques involving magnetic or electrostatic deflection of the ion beam in one direction and mechanical scanning of the target substrate in another, usually orthogonal direction.

Regardless of species being implanted, a significant objective in the ion implantation of semiconductor wafers is to obtain the correct cumulative ion dose, plus ion dose uniformity throughout the wafer, or portions of the wafer targeted by the implanted ions. The implanted dose determines the electrical activity of the implanted region, while dose uniformity insures that all devices on the semiconductor wafer have operating characteristics within specified limits. Semiconductor fabrication processes frequently call for dose accuracy within one percent, and dose uniformity of less than one percent.

Some implantation systems monitor dose by measuring beam current during an implant process using an ion beam current detector (usually a Faraday cup) positioned 'behind' the plane of the wafer so that, as the beam and the wafer move relative to each other, the beam can fall on the Faraday cup. When multiple wafers are being implanted, this may be achieved by positioning the cup behind the movable (usually rotatably) wafer holder with one or more gaps/slits in the holder through which the beam can pass to the cup which is aligned with the general path of the beam. The measured beam current includes electrons generated during ion implantation, and excludes neutral molecules that are implanted into the target, even though these neutral molecules contribute to the total dose. Given that the current is measured after the beam passes through the wafer being implanted, the measured current thus depends upon the characteristics of the wafer, which may produce errors in the measured current due to interactions of the beam with materials on or within the wafer. These wafer characteristics include emissivity, local charging, gas emission from photoresist on the wafer, and the like.

In conventional ion implantation systems that involve the application of a high-energy beam to the wafer, cumulative ion dose is also typically measured by a Faraday cup, or a Faraday cage, situated in the vicinity of the target wafer. The Faraday cage is typically a conductive enclosure, often with the wafer located at the downstream end of the enclosure and constituting part of the Faraday system. The ion beam passes through the Faraday cage to the wafer and produces an electrical current in the Faraday. The Faraday current is supplied to an electronic dose processor, which integrates the current with respect to time to determine the total ion dosage. The dose processor may be part of a feedback loop that is used to control the ion implanter. Dose uniformity can be monitored by a corner cup arrangement. The beam is scanned over the area of the mask with the portion passing through the central opening impinging on the target wafer. Small Faraday cups are located at the four corners of the mask and sense the beam current at these locations. Individual conductors at each corner connect the four corner cups to a monitoring system which determines the deviation of the beam current at each corner from an average value. In some systems, the corner cups have been connected in common for measurement of cumulative ion dose.

Beam ions are generally neutralized by collisions with residual gas molecules in the chamber and it is known that the proportion of ions that become neutralized increases with increasing residual gas pressure. Collisions may also result in the state of charge of beam ions being increased, e.g. from singly to doubly charged or reduced, e.g. from doubly to singly charged. Both of these effects can contribute to beam current measuring errors.

Some ion implantation equipment manufacturers attempt to compensate for neutral ions in an ion beam in the dose control system of their ion implanters by measuring the gas pressure in the implantation volume. This gas pressure signal is then used to calculate an effective or corrected beam current value in accordance with a predetermined relationship between the gas pressure, the apparent or measured beam current and a term which is commonly referred to as the Pressure Compensation factor (PCF). The resulting effective beam current value is then supplied to the dose control system. A dynamic mode of operation is utilized in which values for PCF are determined during an ion implantation process, by comparing simultaneous measurements of measured ionic current and pressure, with corresponding simultaneous measurements taken previously during the process. However, a linear relationship is assumed between corrected beam current and residual gas pressure, which provides limited accuracy, particularly at higher beam energies. An additional parameter, γ, interpreted as the ratio of final steady charge state to the initial injected charge state, has also been disclosed in the prior art. Both PCF and γ are determined empirically prior to performing production implant runs, and the values stored for each particular process recipe to be optimized. The requirement of performing multiple test implants in order to assemble empirical values for PCF and γ for each implant recipe is a time consuming, labor-intensive effort. Moreover, an unexpected parameter change during an implant process could result in the computations being inaccurate, because the computations use the pre-determined PCF and γ values to calculate a corrected beam current. This inaccuracy would result in unacceptable dose errors.

Other ion implantation equipment manufacturers control the dose by compensating for vacuum fluctuations during an implantation process based on detected beam current and not based on a detected gas pressure within an implantation chamber. This is accomplished by determining a reference value for the ion beam current by measuring the ion beam current when a vacuum level along the beam line is at a relatively high and stable level before implantation of a wafer begins. Once the reference value is established, implantation of the wafer is performed, and the ion beam current is measured during implantation. A difference between the reference value and the measure ion beam current is determined, and the implantation process parameters, e.g., ion beam current, or a wafer scan rate, may be adjusted accordingly. This method compensates mainly for non-line-of-sight collisions to adjust the wafer dose accordingly.

Various Faraday cage and Faraday cup configurations (beam current detectors) for ion implanters have been disclosed in the prior art. However, the existing beam current detectors typically detect only charged particles, but not neutral particles. These neutral particles may be caused by photoresist or other materials coated on a wafer that outgas, volatize, or sputter when the ion beam impacts the wafer. This outgassing releases gas particles which may collide with ions in the ion beam and cause ions in the beam to undergo a charge change. These charge exchanging collisions can cause problems because the detectors used to determine and control the ion beam current (and also the total dose of the wafer) during implantation typically only detect charged particles. The neutral particles implanted in the wafer are the desired implantation species, may have the desired energies for implantation, and thus should be counted in the total implant dose: However, because the detectors normally do not detect ions which have been neutralized prior to being implanted in the wafer, they typically understate the true rate of delivery of desired species, including both ions and neutrals, in the beam.

Therefore, what is needed is a method for compensating for the contribution of uncharged or neutral particles to the total ion dose implanted into semiconductor wafers during an implantation process.

BRIEF DESCRIPTION OF THE DRAWINGS

Other advantages, features and characteristics of the present invention, as well as methods, operation and functions of related elements of structure, and the combinations of parts and economies of manufacture, will become apparent upon consideration of the following description and claims with reference to the accompanying drawings, all of which form a part of the specification, wherein like reference numerals designate corresponding parts in the various figures, and wherein:

DETAILED DESCRIPTION OF THE FIGURES

Figure 1:
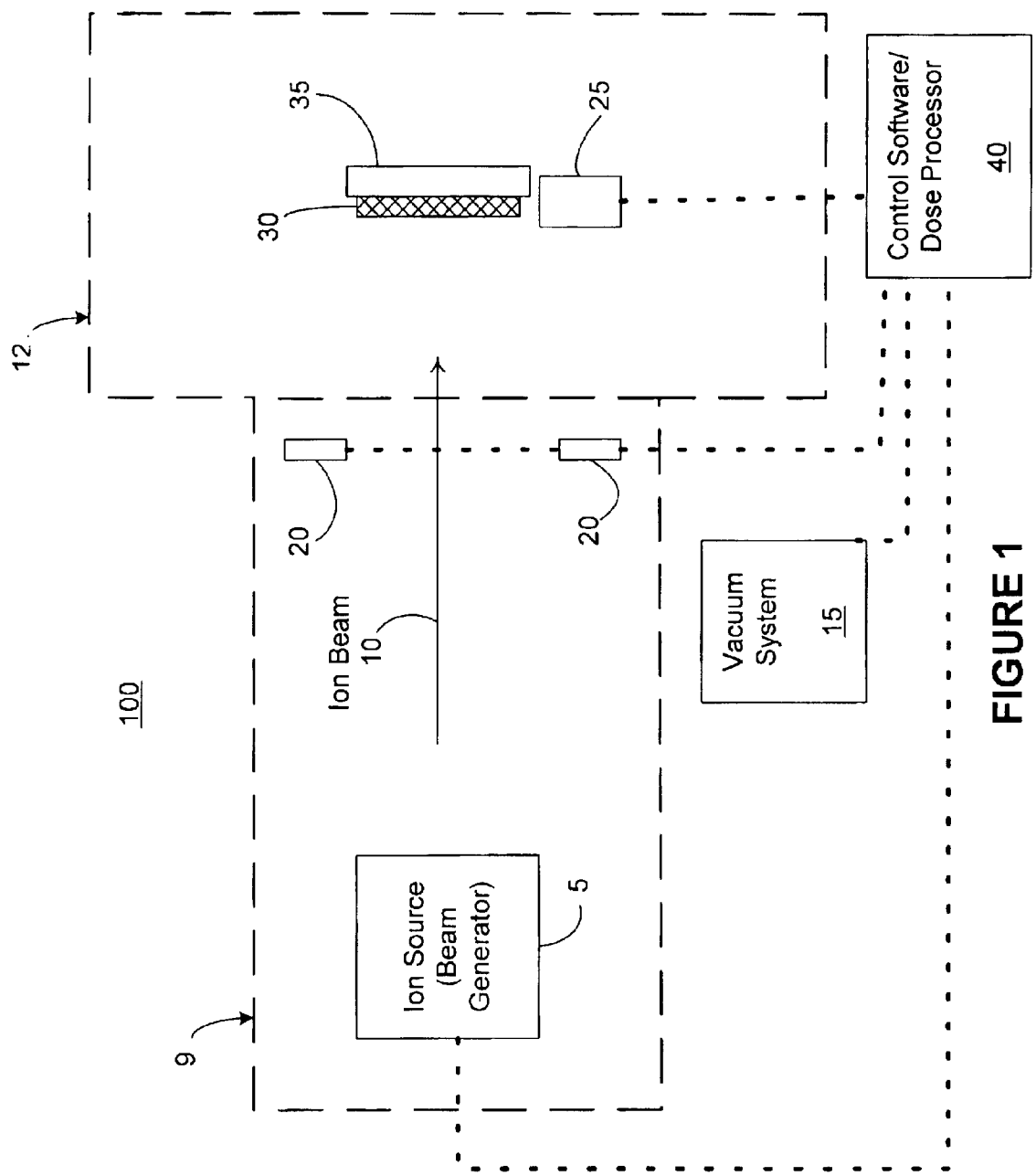
FIG. 1 is a simplified block diagram of a portion of an ion implantation system incorporating the dose control method according to at least one embodiment of the present invention.
Figure 2:
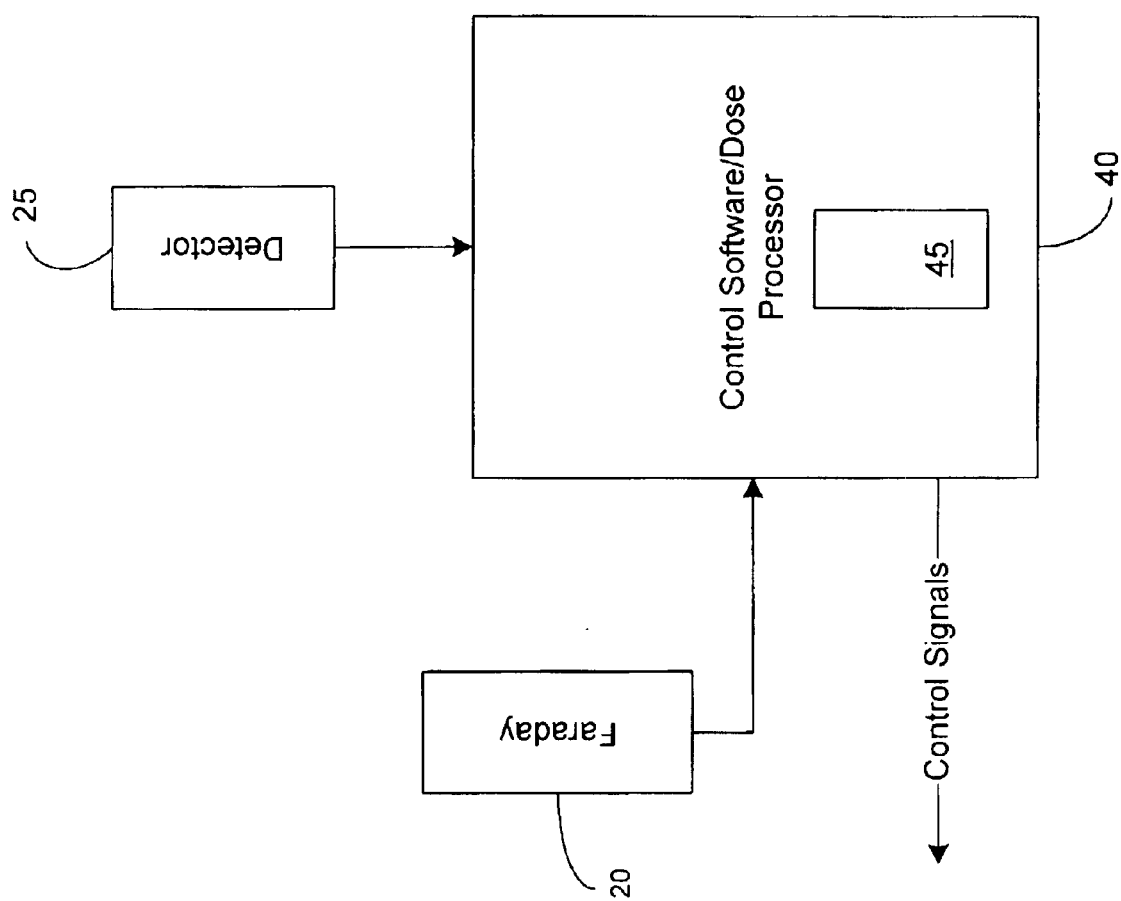
FIG. 2 is a block diagram of the dose processor and control software module shown in FIG. 1 according to at least one embodiment of the present invention.
Figure 3:
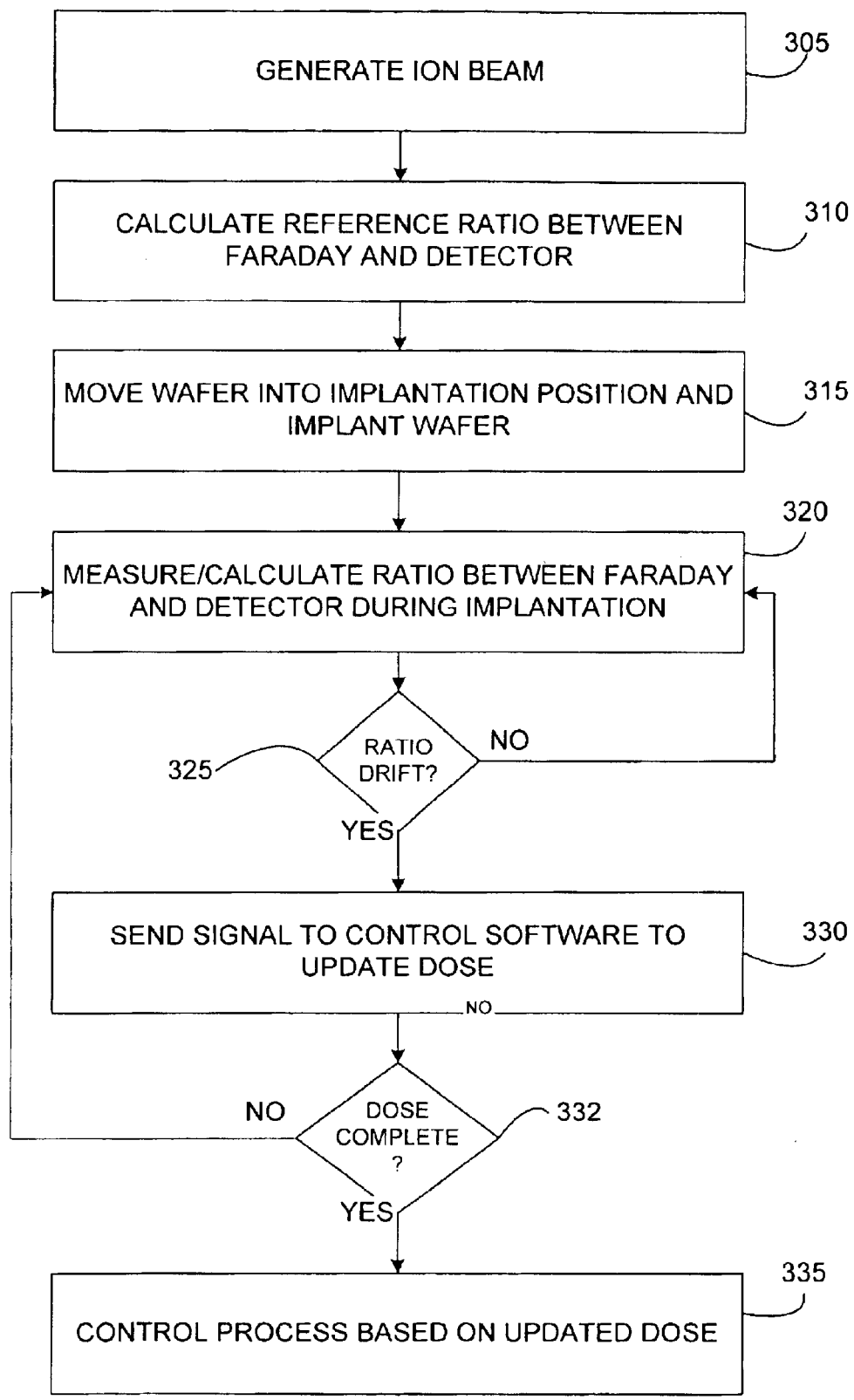
FIG. 3 is a flow chart of steps of a method for compensating for dose error during an ion implantation process according to at least one embodiment of the present invention.

FIGS. 1–3 illustrate a method for compensating for charge neutralization dose errors created by outgassing, volatization, sputtering, and other events which may occur when an ion beam impinges upon semiconductor wafers during an ion implantation process, particularly in the case of wafers which are coated with photoresist. In the various embodiments, the invention is implemented by the addition of one or more detectors to the beam current measurement arrangement and computer control software. In the following description, numerous specific details are set forth to provide a thorough description of the invention. However, it will be apparent to one skilled in the art that the invention may be practiced without these specific details, or with other specific details. In other instances, well-known features have not been described in detail so as not to obscure the invention.

FIG. 1 is a simplified block diagram of a portion of an ion implantation system 100 incorporating the dose error control method according to at least one embodiment of the present invention. The ion implantation system 100 includes an ion source (beam generator) 5 which generates and directs an ion beam 10 toward a target 30, such as a semiconductor wafer, mounted on a support platen 35, and a Faraday 20. Faraday cup 20 is used as the primary dosing reference and is typically located in an enclosure 9 (outside of target chamber 12), where charge exchange is minimal. Faraday cup 20 accepts ions when the beam 10 is in the over-scan region. The over-scan region is that region where the beam 10 is not impinging directly upon a target 30, but rather to either side of a target 30 during implantation. The beam 10 is generally transported from the ion source 5 to the target 30 in a relatively high vacuum environment produced in an enclosure 9 and target chamber 12 by a vacuum system 15. The vacuum in the enclosure 9 and target chamber 12 is maintained using well-known systems such as vacuum pumps, vacuum isolation valves, pressure sensors, and the like. The vacuum system 15 may generally have a physical connection with which to communicate with the control software 40 to supply information about the vacuum level in various sections of enclosure 9 or target chamber 12.

The ion source 5 can include a range of components to generate an ion beam 10 having selected characteristics, and may generally be physically connected via wiring, cables, and the like, to communicate with control software/dose processor 40. Ion beam 10 can be any type of charged particle beam, e.g., an energetic ion beam used to implant the target 30. The target 30 may include any variety of semiconductor materials, or any other substances to be implanted using ion beam 10. Ion beam 10 is shown in FIG. 1 as following a straight path in enclosure 9 to target chamber 12 from the ion source 5 to the target 30. In practice, however, the ion beam 10 may follow a curved pathway with various deflectors between the ion source 5 and the target 30, such as magnets, lenses, or other optical devices which are not shown in FIG. 1. It should also be noted that even though target 30 is shown as being mounted on a fixed, single platen 35 in FIG. 1, in practice more than one wafer 30 may be mounted on a moveable platen connected to a wafer drive device or system (not illustrated) capable of physically manipulating the wafer 30 in a desired manner. For example, a wafer drive system can include servo drive motors, solenoids, screw drive mechanisms, position-encoding devices, mechanical linkages, robotic arms, or any other components as are known in the art to move target 30. The control software 40 is capable of communicating with the wafer drive device or system to affect movement of the target 30.

In an exemplary calibration step of an embodiment, the ion beam 10 is generated under normal operating conditions, e.g., a relatively high-level, stable vacuum exists along the beam 10 line, and no target 30 (semiconductor wafer) is in the target position to be implanted (no beam 10 incident upon a target 30). At least one additional detector 25 is positioned behind (not shown) the target 30 location, or alternately, adjacent to the target 30 position, as is seen in FIG. 1. In the various embodiments, the detector 25 can be a Faraday cup, ion counter, or other device capable of detecting an ion beam, as are well known to those of skill in the art. The detector 25 can be fixed in place or moveable, and can be sited in a assortment of diverse locations, such as along the beam path to the wafer target position, adjacent the wafer target position, behind the wafer target position, and the like.

The detector 25 outputs a signal representing the detected beam 10 dose at the location of detector 25 to the control software/dose processor 40. At the same time, the Faraday 20 outputs a signal representing the beam 10 current to the control software/dose processor 40. For example, the detector 25 may output an analog signal that represents a number of detected ions, and the Faraday 20 may output an analog signal that represents the beam 10 current, and the control software/dose processor 40 may convert these analog signals to digital numbers, calculate a ratio between the two numbers, and store this ratio within the control software/dose processor 40 as a digital number. The stored digital number may be used to establish a reference ratio between the beam 10 current as measured by the Faraday 20, and the ion dose as measured by the embodied detector 25, under the aforementioned normal operating conditions. This ratio can then be used by the control software/dose processor 40 as a reference level during subsequent implantation processes. Depending upon the location of detector 25 (behind the target 30 or adjacent to the target 30), the reference ratio can be in the range of approximately 100:1 to 1:1.

A semiconductor wafer would then be moved to the target 30 location, and simultaneous measurements made with the detector 25 and Faraday 20, as before, to determine the ratio between the beam 10 current and the detector 25 during an implantation process of a target 30. Any substantial deviation or drift from the reference ratio would indicate the dose error due to charge neutralization from wafer outgassing during implantation. Because the drift from the reference ratio is primarily based upon neutralization of the ion beam, the amount of drift can be used to determine a much closer approximation of the total dose imparted to the target 30 than the implantation dose which would be normally be obtained from a single Faraday system such as Faraday 20. In addition, data can be provided continually throughout an implantation process, and the method is not affected by any fluctuations in vacuum which might occur during an implantation process. The functions of the control software/dose processor 40 to compensate for this dose error are described in greater detail below.

FIG. 2 is a block diagram of the dose processor and control software module as used by ion implantation system 100 shown in FIG. 1. The control software/dose processor 40, in the various embodiments disclosed herein, could be configured to use the ratio drift data to update the accumulated dose in the Faraday cup 20 and thus compensate for the dose error due to charge neutralization. As before, when detector 25 and Faraday 20 are used under normal operating conditions (high and stable vacuum, no wafer being implanted) to establish a reference ratio, this reference value would be stored by the control software/dose processor 40. A detected dose module 45 can be used to compare the reference ratio obtained from control software/dose processor 40 to subsequent ratios obtained during ion implantation of a semiconductor wafer. When a difference exists between the implantation ratio and the reference ratio, due to charge neutralization caused by outgassing from a wafer during implantation, detected dose module 45 would send a signal to the control software/dose processor 40, which can be used to send control signals to the vacuum system 15, ion source 5, and other systems as are known to those of skill in the art. The detected dose module 45, through the control software/dose processor 40, can be used to effectively compensate for the dose error due to ion beam neutralization, while an implantation process is taking place (in real time). Thus, detector 25 can be used to determine the total dose even though detector 25 does not detect the presence of the uncharged particles. It should be noted that although detected dose module 45 is shown as being an internal module within control software/dose processor 40, it may be implemented as an add-on, exterior module to control software/dose processor 40 in other embodiments.

The control software/dose processor 40 of an ion implantation system is used for controlling the various parameters, i.e., beam current, scan rate, vacuum, and the like, and the addition of detector 25 and detected dose module 45 to provide dose compensation would not affect these other functions of control software/dose processor 40. For example, control software/dose controller 40 may determine that the beam current as measured by Faraday 20 is due to a variation at the ion source rather than because of a vacuum fluctuation due to outgassing from a wafer, and would still be able to adjust the ion generation parameters accordingly.

Referring now to FIG. 3, a flow chart of steps of a method for compensating for dose error during an ion implantation process according to at least one embodiment of the present invention will be discussed. In step 305 an ion beam of any type of desired ion species at any desired energy is generated in any one of various ways known to those of skill in the art. A reference ratio is determined in step 310. In an embodiment, the reference ratio is calculated by determining the value from a detector measurement signal and a Faraday measurement signal taken under normal operating conditions, e.g., a relatively high-level, stable vacuum exists in the target chamber, and the generated beam is not incident upon a semiconductor wafer at the target position. The detector as disclosed in the various embodiments herein can be any type of device that detects a dose component of the generated ion beam. For example, the detector can be a Faraday cup or other device, as are well known to those of skill in the art. The detector can be fixed in place or moveable, and can be sited in a assortment of diverse locations, such as along the beam path to the wafer target position, adjacent the wafer target position, behind the wafer target position, and the like. In one embodiment, the reference ratio is calculated and stored by control/dose processor software. In other embodiments, the reference ratio may be retrieved from memory.

In step 315, a wafer is moved into the implantation position and implanted using the ion beam generated in step 305. In other embodiments, the reference ratio value is not necessarily determined when a wafer is out of the beam path, but may be determined when a target, e.g., a wafer or other material to be implanted is in a position to be implanted and the vacuum along the beam line is at a desired level, for example, at the beginning of implantation in step 315. During implantation, measurements from the detector and the Faraday are communicated to the control software/dose processor, and an 'as implanted ratio' is determined, as in step 320. A detected dose module can be used to compare the reference ratio obtained from control software/dose processor to subsequent ratios obtained during wafer implantation, in real time.

In step 325, if a difference exists between the implantation ratio and the reference ratio, step 330 would be executed, and the detected dose module would send a signal to the control software/dose processor to update the dose counter. If no ratio drift occurs in step 325, the system would check to determine if the required amount of dose is completed, as in step 332. If the desired implantation dose has been achieved in step 332, in step 335 control software/dose processor sends control signals to the various other components in the ion implantation that the total desired ion dose has been implanted into a wafer, and hence to cease further ion implantation of that wafer. Otherwise, the process returns to step 320 and continues taking measurements and calculating 'as implanted' ratios for comparison with the reference ratio. In step 335, control software/dose processor, after sending a signal to cease implantation when the desired implantation dose has been achieved in step 332, could also signal a wafer drive device to manipulate the wafer out of the implantation position and to move another wafer into the implantation position, as in step 315, where the process would continue.

The various functions and components in the present application may be implemented using an information-handling machine such as a data processor, or a plurality of processing devices. Such a data processor may be a microprocessor, microcontroller, microcomputer, digital signal processor, state machine, logic circuitry, and/or any device that manipulates digital information based on operational instruction, or in a predefined manner. Generally, the various functions, and systems represented by block diagrams are readily implemented by one of ordinary skill in the art using one or more of the implementation techniques listed herein.

When a data processor for issuing instructions is used, the instruction may be stored in memory. Such a memory may be a single memory device or a plurality of memory devices. Such a memory device may be a read-only memory device, random access memory device, magnetic tape memory, floppy disk memory, hard drive memory, external tape, and/or any device that stores digital information. Note that when the data processor implements one or more of its functions via a state machine or logic circuitry, the memory storing the corresponding instructions may be embedded within the circuitry that includes a state machine and/or logic circuitry, or it may be unnecessary because the function is performed using combinational logic.

The method and apparatus herein provides for a flexible implementation. Although the invention has been described using certain specific examples, it will be apparent to those skilled in the art that the invention is not limited to these few examples. For example, the disclosure is discussed herein primarily with regard to dose error compensation for a scanned charged particle beam ion implantation system, however, the invention can be used with other systems or processes that use beams of energetic, charged particles, such as electron beam imaging systems. Additionally, various types of ion measurement devices are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method of exposing a target material to an ion beam in an ion implantation system, the method comprising:

detecting an ion beam at a first location with a first detector;

detecting the ion beam at a second location with a second detector at the same time as the first detector, quantifying an amount of ion beam neutralization based upon a measurement deviation between the first detector and the second detector, wherein quantifying includes determining a reference ratio at a first ion beam current at the first location of a processing chamber and the second location of a processing chamber, wherein the first location is further from a first target of the ion beam than the second location;

determining a current ratio of a second ion beam current at the first location and the second location, wherein the second ion beam current is being used to process a second target; and determining a charge neutralization component of the ion beam at the second target location based on the reference ratio and the current ratio; and controlling a characteristic of the ion beam of the implantation system based upon the amount of ion beam neutralization.

2. The method of claim 1, wherein the target material is a semiconductor substrate.

3. The method of claim 1, wherein the target material is any substance to be implanted using the ion beam.

4. The method of claim 1, wherein a characteristic is selected from a group consisting of: beam current, beam energy, beam scan rate, vacuum, gas pressure, and ion dose.

5. The method of claim 1, wherein the reference ratio is determined when a relatively high-level, stable vacuum exists along the ion beam line and no target material is present.

6. The method of claim 1, wherein the reference ratio is determined at the beginning of implantation when a relatively high-level, stable vacuum exists along the ion beam line and target material is present.

7. The method of claim 1, wherein controlling includes:

modifying the ion dose based upon the charge neutralization component to create a total dose; and adjusting a process parameter based on the total dose.

8. The method of claim 7, wherein a process parameter is selected from a group consisting of: beam current, beam energy, beam scan rate, vacuum, gas pressure, and ion dose.

9. The method of claim 1, wherein the second detector is fixed in place and sited adjacent to the target position.

10. The method of claim 1, wherein the second detector is moveable and sited adjacent to the target position during measurement.

11. The method of claim 1, wherein the second detector is fixed in place and sited behind the target position.

12. The method of claim 1, wherein the second detector is moveable and sited behind the target position.

13. The method of claim 1, wherein the second detector is sited along the beam path to the target position.

14. The method of claim 1, wherein the reference ratio is in the range of approximately 100:1 to 1:1.

15. The method of claim 14, wherein the range of the reference ratio is dependent upon the location of a first detector with reference to a second detector.

16. The method of claim 14, wherein the reference ratio may be a previously stored value retrieved from control software.

17. A system comprising:

memory;

a processor operably connected to said memory;

a program of instructions, said program of instructions including instructions to receive a first measurement from a first detector and to receive a second measurement from a second detector, and to manipulate said processor to:

quantify an amount of ion beam neutralization based upon a measurement deviation between the first detector and the second detector, wherein the first detector and the second detector measure an ion beam at the same time, where to quantify includes:

determining a reference ratio at a first ion beam current at a first location of a processing chamber and a second location of a processing chamber, wherein the first location is further from a first target of the ion beam than the second location;

determining a current ratio of a second ion beam current at the first location and the second location, wherein the second ion beam current is being used to process a second target;

determining a charge neutralization component of the ion beam at the second target location based on the reference ratio and the current ratio; and control a characteristic of the ion beam of an ion implantation system based upon the amount of ion beam neutralization.

18. The system of claim 7, wherein a characteristic is selected from a group consisting of: beam current, beam energy, beam scan rate, vacuum, gas pressure, and ion dose.

19. The system of claim 17, wherein controlling includes:

modifying the ion dose based upon the charge neutralization component to create a total dose; and adjusting a process parameter based on the total dose.

20. The system of claim 19, wherein a process parameter is selected from a group consisting of:

beam current, beam energy, beam scan rate, vacuum, gas pressure, and ion dose.

* * * * *

UNITED STATES PATENT AND TRADEMARK OFFICE
CERTIFICATE OF CORRECTION

PATENT NO. : 6,797,967 B1
DATED : September 28, 2004
INVENTOR(S) : Tom Tse, Zhiyong Zhao and David M. Hendrix It is certified that error appears in the above-identified patent and that said Letters Patent is hereby corrected as shown below:

Column 10,
Line 20, please change "claim 7" to -- claim 17 --.

Signed and Sealed this

Fifteenth Day of March, 2005

JON W. DUDAS
*Director of the United States Patent and Trademark Office*